(12) United States Patent
Nam et al.

(10) Patent No.: US 11,127,571 B2
(45) Date of Patent: *Sep. 21, 2021

(54) PERIPHERAL RF FEED AND SYMMETRIC RF RETURN FOR SYMMETRIC RF DELIVERY

(71) Applicant: Lam Research Corporation, Fremont, CA (US)

(72) Inventors: Sang Ki Nam, Danville, CA (US); Rajinder Dhindsa, Milpitas, CA (US); James Rogers, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/750,001

(22) Filed: Jan. 23, 2020

(65) Prior Publication Data

US 2020/0161097 A1 May 21, 2020

Related U.S. Application Data

(63) Continuation of application No. 13/403,760, filed on Feb. 23, 2012, now Pat. No. 10,586,686.

(Continued)

(51) Int. Cl.
*H01J 37/32* (2006.01)
*H01L 21/683* (2006.01)

(52) U.S. Cl.
CPC .. *H01J 37/32577* (2013.01); *H01J 37/32091* (2013.01); *H01J 37/32715* (2013.01); *H01L 21/6831* (2013.01)

(58) Field of Classification Search
CPC ... C23C 14/50; C23C 16/458; C23C 16/4586; H01J 37/32091; H01J 37/32577;

(Continued)

(56) References Cited

U.S. PATENT DOCUMENTS 4,340,462 A 7/1982 Koh
5,183,990 A 2/1993 Enyedy
(Continued)

FOREIGN PATENT DOCUMENTS

CN 1661130 8/2005
CN 1961402 A 5/2007
(Continued)

OTHER PUBLICATIONS

Bera et al., "Control of Plasma Uniformity Using Phase Difference in a VHF Plasma Process Chamber," IEEE Transactions on Plasma Science, vol. 36, No. 4, Aug. 2008, p. 1366-1367.

(Continued)

*Primary Examiner* — Benjamin Kendall
(74) *Attorney, Agent, or Firm* — Penilla IP, APC (57) ABSTRACT

A chuck assembly for plasma processing, including: an electrostatic chuck having a substrate support surface on a first side; a facility plate coupled to the electrostatic chuck on a second side; a RF feed defined by a first portion contacting a periphery of the facility plate and a second portion coupled to the first portion, the second portion extending away from the chuck assembly, the first portion being a bowl-shaped section, wherein the second portion connects to the first portion at an opening defined in the bowl-shaped section; wherein the first portion of the RF feed contacts the periphery of the facility plate at a circumference circumference having a radius greater than one-half of a radius of the facility plate, the radius of the circumference being less than the radius of the facility plate; a grounded shield disposed below and surrounding at least a portion of the bowl-shaped section.

17 Claims, 10 Drawing Sheets

Related U.S. Application Data (60) Provisional application No. 61/563,503, filed on Nov. 23, 2011, provisional application No. 61/563,021, filed on Nov. 22, 2011.

(58) Field of Classification Search
CPC .......... H01J 37/32697; H01J 37/32715; H01J 37/32724; H01L 21/6831; H01L 21/6833; H01L 21/68785; H01L 21/68792
See application file for complete search history.

(56) References Cited

U.S. PATENT DOCUMENTS

| | | | |
|---|---|---|---|
| 5,250,137 | A | 10/1993 | Arami et al. |
| 5,305,240 | A | 4/1994 | Sameshima et al. |
| 5,349,271 | A | 9/1994 | Van Os et al. |
| 5,460,684 | A | 10/1995 | Saeki et al. |
| 5,620,524 | A | 4/1997 | Fan et al. |
| 5,689,215 | A | 11/1997 | Richardson et al. |
| 5,885,423 | A | 3/1999 | Guyot |
| 5,889,252 | A | 3/1999 | Williams et al. |
| 5,968,587 | A | 10/1999 | Frankel |
| 5,998,933 | A | 12/1999 | Shun'ko |
| 6,023,405 | A | 2/2000 | Shamoulian et al. |
| 6,074,512 | A | 6/2000 | Collins et al. |
| 6,150,628 | A | 11/2000 | Smith et al. |
| 6,264,788 | B1 | 7/2001 | Tomoyasu et al. |
| 6,302,964 | B1 | 10/2001 | Umotoy et al. |
| 6,302,965 | B1 | 10/2001 | Umotoy et al. |
| 6,337,460 | B2 | 1/2002 | Kelkar et al. |
| 6,377,437 | B1 | 4/2002 | Sexton et al. |
| 6,392,351 | B1 | 5/2002 | Shun'ko |
| 6,432,260 | B1 | 8/2002 | Mahoney et al. |
| 6,494,958 | B1 | 12/2002 | Shamouilian et al. |
| 6,527,911 | B1 | 3/2003 | Yen et al. |
| 6,528,751 | B1 | 3/2003 | Hoffman et al. |
| 6,557,248 | B1 | 5/2003 | Shamouilian et al. |
| 6,646,233 | B2 | 11/2003 | Kanno et al. |
| 6,669,783 | B2 | 12/2003 | Sexton et al. |
| 6,825,618 | B2 | 11/2004 | Pu et al. |
| 6,855,906 | B2 | 2/2005 | Brailove |
| 6,872,259 | B2 | 3/2005 | Strang |
| 6,924,455 | B1 | 8/2005 | Chen et al. |
| 7,264,688 | B1 | 11/2007 | Paterson et al. |
| 7,363,876 | B2 | 4/2008 | Lai et al. |
| 7,393,432 | B2 | 7/2008 | Dhindsa et al. |
| 7,393,433 | B2 | 7/2008 | Takamasa et al. |
| 7,405,521 | B2 | 7/2008 | Dhindsa et al. |
| 7,581,511 | B2 | 9/2009 | Mardian et al. |
| 7,619,179 | B2 | 11/2009 | Hayashi |
| 7,683,289 | B2 | 3/2010 | Dhindsa et al. |
| 7,712,434 | B2 | 5/2010 | Dhindsa et al. |
| 7,829,815 | B2 | 11/2010 | Chen et al. |
| 7,939,778 | B2 | 5/2011 | Larson et al. |
| 8,012,306 | B2 | 9/2011 | Dhindsa |
| 8,056,503 | B2 | 11/2011 | Kikuchi et al. |
| 8,293,068 | B2 | 10/2012 | Koshimizu et al. |
| 8,485,128 | B2 | 7/2013 | Kellogg et al. |
| 8,522,716 | B2 | 9/2013 | Kadkhodayan et al. |
| 8,552,334 | B2 | 10/2013 | Tappan et al. |
| 8,618,446 | B2 | 12/2013 | Chang et al. |
| 8,652,298 | B2 | 2/2014 | Dhindsa et al. |
| 8,674,255 | B1 | 3/2014 | Lenz et al. |
| 8,735,765 | B2 | 5/2014 | Tappan et al. |
| 8,898,889 | B2 | 12/2014 | Nam et al. |
| 8,906,197 | B2 | 12/2014 | Dhindsa |
| 9,111,724 | B2 | 8/2015 | Keil et al. |
| 9,190,302 | B2 | 11/2015 | Ni et al. |
| 2001/0000104 | A1 | 4/2001 | Li et al. |
| 2001/0002582 | A1 | 6/2001 | Dunham et al. |
| 2001/0037770 | A1 | 11/2001 | Otsubo |
| 2001/0047760 | A1 | 12/2001 | Moslehi |
| 2002/0001976 | A1 | 1/2002 | Danek et al. |
| 2002/0108714 | A1 | 8/2002 | Doering et al. |
| 2002/0170881 | A1 | 11/2002 | Benzing et al. |
| 2002/0197402 | A1 | 12/2002 | Chiang et al. |
| 2003/0000473 | A1 | 1/2003 | Chae et al. |
| 2003/0015965 | A1 | 1/2003 | Godyak |
| 2003/0027428 | A1 | 2/2003 | Ng et al. |
| 2003/0029567 | A1 | 2/2003 | Dhindsa et al. |
| 2003/0031794 | A1 | 2/2003 | Tada et al. |
| 2003/0071035 | A1 | 4/2003 | Brailove |
| 2003/0094903 | A1 | 5/2003 | Tao et al. |
| 2003/0098372 | A1 | 5/2003 | Kim |
| 2003/0136766 | A1 | 7/2003 | Hoffman et al. |
| 2003/0137251 | A1 | 7/2003 | Mitrovic et al. |
| 2003/0178140 | A1 | 9/2003 | Hanazaki et al. |
| 2003/0188685 | A1 | 10/2003 | Wang et al. |
| 2004/0003777 | A1 | 1/2004 | Carpenter et al. |
| 2004/0027781 | A1 | 2/2004 | Hanawa et al. |
| 2004/0035365 | A1 | 2/2004 | Yamazawa et al. |
| 2004/0040502 | A1 | 3/2004 | Basceri et al. |
| 2004/0040503 | A1 | 3/2004 | Basceri et al. |
| 2004/0047720 | A1 | 3/2004 | Lerner et al. |
| 2004/0050327 | A1 | 3/2004 | Johnson et al. |
| 2004/0083961 | A1 | 5/2004 | Basceri |
| 2004/0118344 | A1 | 6/2004 | Ni et al. |
| 2004/0149394 | A1 | 8/2004 | Doan et al. |
| 2004/0149699 | A1 | 8/2004 | Hoffman et al. |
| 2004/0175953 | A1 | 9/2004 | Ogle |
| 2004/0178180 | A1 | 9/2004 | Kaji et al. |
| 2004/0226507 | A1 | 11/2004 | Carpenter et al. |
| 2005/0000655 | A1 | 1/2005 | Wi |
| 2005/0001556 | A1 | 1/2005 | Hoffman et al. |
| 2005/0006028 | A1 | 1/2005 | Keil et al. |
| 2005/0023254 | A1 | 2/2005 | Hayashi et al. |
| 2005/0087302 | A1 | 4/2005 | Mardian et al. |
| 2005/0160985 | A1 | 7/2005 | Brcka |
| 2005/0184670 | A1 | 8/2005 | Lacoste et al. |
| 2005/0194100 | A1 | 9/2005 | Or et al. |
| 2005/0217582 | A1 | 10/2005 | Kim et al. |
| 2005/0264218 | A1 | 12/2005 | Dhindsa et al. |
| 2005/0268856 | A1 | 12/2005 | Miller et al. |
| 2006/0021701 | A1 | 2/2006 | Tobe et al. |
| 2006/0060302 | A1 | 3/2006 | White et al. |
| 2006/0065623 | A1 | 3/2006 | Guiney et al. |
| 2006/0075969 | A1 | 4/2006 | Fisher |
| 2006/0081564 | A1 | 4/2006 | Moroz et al. |
| 2006/0090850 | A1 | 5/2006 | Laflamme, Jr. et al. |
| 2006/0118518 | A1 | 6/2006 | Rusu et al. |
| 2006/0191879 | A1 | 8/2006 | Tomita et al. |
| 2006/0237138 | A1 | 10/2006 | Qin |
| 2007/0012659 | A1 | 1/2007 | Rusu et al. |
| 2007/0081295 | A1 | 4/2007 | Brillhart et al. |
| 2007/0084563 | A1 | 4/2007 | Holland |
| 2007/0170155 | A1 | 7/2007 | Fink |
| 2007/0193688 | A1 | 8/2007 | Dhindsa et al. |
| 2007/0199658 | A1 | 8/2007 | Dhindsa et al. |
| 2007/0235420 | A1 | 10/2007 | Yamazawa |
| 2007/0235426 | A1 | 10/2007 | Matsumoto et al. |
| 2007/0251642 | A1 | 11/2007 | Bera et al. |
| 2008/0020574 | A1 | 1/2008 | Marakhtanov et al. |
| 2008/0041820 | A1 | 2/2008 | Tong et al. |
| 2008/0171444 | A1 | 7/2008 | Dhindsa et al. |
| 2008/0173237 | A1 | 7/2008 | Collins et al. |
| 2008/0179007 | A1 | 7/2008 | Collins et al. |
| 2008/0182416 | A1 | 7/2008 | Collins et al. |
| 2008/0230377 | A1 | 9/2008 | Kiehlbauch |
| 2008/0230518 | A1 | 9/2008 | Brillhart et al. |
| 2008/0236750 | A1 | 10/2008 | Koshimizu |
| 2008/0274297 | A1 | 11/2008 | Furuta et al. |
| 2008/0286697 | A1 | 11/2008 | Verhaverbeke et al. |
| 2008/0302652 | A1 | 12/2008 | Entley et al. |
| 2008/0302781 | A1 | 12/2008 | Murakami et al. |
| 2009/0025879 | A1 | 1/2009 | Rauf et al. |
| 2009/0066315 | A1 | 3/2009 | Hu et al. |
| 2009/0109595 | A1 | 4/2009 | Herchen et al. |
| 2009/0149028 | A1 | 6/2009 | Marakhtanov et al. |
| 2009/0200268 | A1 | 8/2009 | Tappan et al. |
| 2009/0200269 | A1 | 8/2009 | Kadkhodayan et al. |
| 2009/0230089 | A1 | 9/2009 | Bera et al. |
| 2009/0242135 | A1 | 10/2009 | Koshimizu et al. |
| 2009/0272492 | A1 | 11/2009 | Katz et al. |
| 2009/0274590 | A1 | 11/2009 | Willwerth et al. |

(56) References Cited

U.S. PATENT DOCUMENTS

| | | |
|---|---|---|
| 2009/0277585 A1 | 11/2009 | Maebashi et al. |
| 2009/0305509 A1 | 12/2009 | Stevenson et al. |
| 2009/0321019 A1 | 12/2009 | Chen et al. |
| 2010/0003829 A1 | 1/2010 | Patrick et al. |
| 2010/0008015 A1 | 1/2010 | Booth et al. |
| 2010/0008016 A1 | 1/2010 | Onate et al. |
| 2010/0018648 A1 | 1/2010 | Collins et al. |
| 2010/0065215 A1 | 3/2010 | Jeon et al. |
| 2010/0072172 A1 | 3/2010 | Ui et al. |
| 2010/0096261 A1 | 4/2010 | Hoffman et al. |
| 2010/0098875 A1 | 4/2010 | Fischer et al. |
| 2010/0116788 A1 | 5/2010 | Singh et al. |
| 2010/0116790 A1 | 5/2010 | Spitzl |
| 2010/0140223 A1 | 6/2010 | Tyler et al. |
| 2010/0147050 A1 | 6/2010 | Barth |
| 2010/0196626 A1 | 8/2010 | Choi et al. |
| 2010/0247804 A1 | 9/2010 | Roy |
| 2010/0252199 A1 | 10/2010 | Marakhtanov et al. |
| 2010/0294433 A1 | 11/2010 | Jianhui |
| 2010/0319852 A1 | 12/2010 | Brillhart et al. |
| 2011/0056514 A1 | 3/2011 | Lee et al. |
| 2011/0059615 A1 | 3/2011 | Marakhtanov et al. |
| 2011/0061687 A1 | 3/2011 | Mikhaylichenko et al. |
| 2011/0075313 A1 | 3/2011 | Comendant |
| 2011/0100552 A1 | 5/2011 | Dhindsa et al. |
| 2011/0108524 A1 | 5/2011 | Dhindsa et al. |
| 2011/0185972 A1 | 8/2011 | Baek et al. |
| 2011/0232888 A1 | 9/2011 | Sasaki |
| 2012/0033340 A1 | 2/2012 | Roy et al. |
| 2012/0055632 A1 | 3/2012 | de la Llera et al. |
| 2012/0086541 A1 | 4/2012 | Kester |
| 2013/0023064 A1 | 1/2013 | Marakhtanov et al. |
| 2013/0059448 A1 | 3/2013 | Marakhtanov et al. |
| 2013/0087286 A1 | 4/2013 | Carducci et al. |
| 2013/0126475 A1 | 5/2013 | Dhindsa et al. |
| 2013/0127124 A1 | 5/2013 | Nam et al. |
| 2013/0133834 A1 | 5/2013 | Dhindsa |
| 2013/0260567 A1 | 10/2013 | Marakhtanov et al. |
| 2013/0340938 A1 | 12/2013 | Tappan et al. |
| 2014/0054268 A1 | 2/2014 | Chen et al. |
| 2014/0054269 A1 | 2/2014 | Hudson et al. |
| 2014/0065835 A1 | 3/2014 | Kadkhodayan et al. |
| 2014/0087488 A1 | 3/2014 | Nam et al. |

FOREIGN PATENT DOCUMENTS

| | | |
|---|---|---|
| CN | 1973364 A | 5/2007 |
| CN | 100380606 C | 4/2008 |
| CN | 101546697 | 9/2009 |
| CN | 102084468 | 6/2011 |
| CN | 101971713 A | 9/2011 |
| EP | 1155164 B1 | 7/2010 |
| JP | 04-78133 A | 3/1992 |
| JP | 05-144594 | 7/1993 |
| JP | 05-166595 | 11/1993 |
| JP | 06-252101 A | 9/1994 |
| JP | 2007157696 A | 6/2007 |
| JP | 2009231692 A | 10/2009 |
| JP | 2011511474 A | 4/2011 |
| RU | 2022917 | 11/1994 |
| RU | 2056702 | 3/1996 |
| RU | 2094961 | 10/1997 |
| TW | 454430 | 9/2001 |
| TW | 520621 | 2/2003 |
| TW | 200408000 | 5/2004 |
| TW | 200509192 | 3/2005 |
| TW | 200845138 | 11/2008 |
| TW | 200943457 | 10/2009 |
| TW | 201003771 A1 | 3/2010 |
| TW | 201009996 | 3/2010 |
| TW | 201031280 A1 | 8/2010 |
| TW | 201043099 A | 12/2010 |
| WO | WO 0136703 A1 | 5/2001 |
| WO | WO 2009099660 | 8/2009 |
| WO | WO 2010045037 | 4/2010 |

OTHER PUBLICATIONS

PCT International Search Report and Written Opinion, issued in International Application No. PCT/US2011/001175, dated Nov. 29, 2011 (9 total pages).

PCT International Search Report and Written Opinion, issued in International Application No. PCT/US2011/001174, dated Dec. 6, 2011 (8 total pages).

PCT Int'l Search Report and Written Opinion of the Int'l Searching Authority, or the Declaration, issued in Int'l App No. PCT/US12/66302, dated Feb. 8, 2013 (7 total pgs).

PCT International Search Report and Written Opinion, issued in International Application No. PCT/US2011/001176, dated Jan. 19, 2012 (9 total pages).

PCT International Search Report and Written Opinion, issued in International Application No. PCT/US2012/063987, dated Jan. 28, 2013 (8 total pages).

PCT International Search Report and Written Opinion, issued in International Application No. PCT/US2012/065080, dated Jan. 28, 2013 (10 total pages).

PCT International Search Report and Written Opinion, issued in International Application No. PCT/US2012/065333, dated Jan. 28, 2013 (10 total pages).

PCT International Search Report and Written Opinion, issued in International Application No. PCT/US2012/065684, dated Jan. 28, 2013 (9 total pages).

PCT International Search Report and Written Opinion, issued in International Application No. PCT/US2012/066333, dated Feb. 1, 2013 (8 total pages).

PCT International Search Report and Written Opinion, issued in International Application No. PCT/US2012/065949, dated Feb. 5, 2013 (9 total pages).

PCT International Search Report and Written Opinion, issued in International Application No. PCT/US2012/065677, dated Feb. 7, 2013 (9 total pages).

PCT International Search Report and Written Opinion, issued in International Application No. PCT/US2012/066467, dated Feb. 8, 2013 (6 total pages).

PCT International Search Report and Written Opinion, issued in International Application No. PCT/US2012/066425, dated Feb. 22, 2013 (8 total pages).

PCT International Search Report and Written Opinion, issued in International Application No. PCT/US2012/065122, dated Mar. 25, 2013 (7 total pages).

Search Report of Taiwanese Patent App No. 101144019, dated Sep. 22, 2014 (1 page).

English translation of the Notification of Examination Opinions issued in corresponding Taiwanese App No. 101143995, dated Jul. 7, 2016 with Search Report (11 total pages).

English translation of Notification of Reason(s) for Rejection issued in corresponding Japanese Application No. 2014-543565, dated Sep. 20, 2016, (3 total pages).

PERIPHERAL RF FEED AND SYMMETRIC RF RETURN FOR SYMMETRIC RF DELIVERY

CLAIM OF PRIORITY

This application claims priority as a continuation of U.S. Provisional patent application Ser. No. 13/403,760, filed Feb. 23, 2012, entitled "PERIPHERAL RF FEED AND SYMMETRIC RF RETURN FOR SYMMETRIC RF DELIVERY," which claims priority to U.S. Provisional Patent Application No. 61/563,503, filed Nov. 23, 2011, entitled "PERIPHERAL RF FEED AND SYMMETRIC RF RETURN FOR SYMMETRIC RF DELIVERY," and to U.S. Provisional Patent Application No. 61/563,021, filed Nov. 22, 2011, entitled "SYSTEMS AND METHODS FOR CONTROLLING A PLASMA EDGE REGION," the disclosures of which are incorporated herein by reference.

CROSS REFERENCE TO RELATED APPLICATIONS

This application is related to U.S. patent application Ser. No. 13/301,725, filed Nov. 21, 2011, entitled "TRIODE REACTOR DESIGN WITH MULTIPLE RADIOFREQUENCY POWERS," the disclosure of which is incorporated herein by reference.

BACKGROUND

1. Field of the Invention

The present embodiments relate to wafer processing apparatus, and more particularly, apparatus, methods, and computer programs for processing a wafer in a wafer processing apparatus.

2. Description of the Related Art

The manufacturing of integrated circuits includes immersing silicon substrates (wafers) containing regions of doped silicon in chemically-reactive plasmas, where the submicron device features (e.g., transistors, capacitors, etc.) are etched onto the surface. Once the first layer is manufactured, several insulating (dielectric) layers are built on top of the first layer, where holes, also referred to as vias, and trenches are etched into the material for placement of the conducting interconnectors.

Non-uniform etching can adversely impact wafer yield. Moreover, as the size of the critical dimension shrinks with each new generation of devices, and as wafer sizes increase to facilitate production of higher numbers of devices from the same wafer, non-uniformity requirements become ever more stringent. Thus, controlling non-uniformity is key to enabling more advanced technology nodes to be mass produced in a cost-effective manner.

It is in this context that embodiments of the invention arise.

SUMMARY

Embodiments of the disclosure provide apparatus, methods and computer programs for a peripheral RF feed and symmetric RF return for symmetric RF delivery. It should be appreciated that the present embodiments can be implemented in numerous ways, such as a process, an apparatus, a system, a device, or a method on a computer readable medium. Several embodiments are described below.

In one embodiment, a chuck assembly for plasma processing is provided. The chuck assembly includes an electrostatic chuck having a substrate support surface on a first side, and a facility plate coupled to the electrostatic chuck on a second side that is opposite the substrate support surface. A hollow RF feed is configured to deliver RF power, the hollow RF feed defined by a first portion contacting a periphery of the facility plate and a second portion coupled to the first portion, the second portion extending away from the chuck assembly.

In one embodiment, the first portion is a bowl-shaped section, the second portion is a tubular section, and the second portion connects to the first portion at an opening defined in the bowl-shaped section.

In one embodiment, the hollow RF feed contains facility wires in a bundled configuration in the tubular section and in an expanded configuration in the bowl-shaped section.

In one embodiment, a conducting component is coupled to the facility plate and defined within an interior of the first portion of the hollow RF feed.

In one embodiment, the conducting component is one of a heating device, an electrostatic clamping device, a coolant fitting, and a pin lifter.

In one embodiment, the second portion extends laterally away from the chuck assembly.

In one embodiment, a grounded shield surrounds a location of the hollow RF feed proximate to where the first and second portions are coupled, the grounded shield defining a barrier between the first and second portions of the hollow RF feed.

In one embodiment, an insulating tube is defined within an interior of the second portion.

In one embodiment, the first portion of the hollow RF feed contacts the periphery of the facility plate at a circumference defined on a side of the facility plate opposite the electrostatic chuck, the circumference having a radius greater than one-half of a radius of the facility plate.

In another embodiment, a method for powering a chuck assembly for plasma processing is provided. The method includes method operations of contacting a first end of a hollow RF feed to a periphery of a facility plate; and applying RF power to a second end of the hollow RF feed extending away from the chuck assembly, the hollow RF feed delivering the applied RF power to the facility plate.

In one embodiment, the applied RF power is delivered over a tubular section of the hollow RF feed including the second end and a bowl-shaped section of the hollow RF feed including the first end.

In one embodiment, the method includes delivering current over facility wires in a bundled configuration in the tubular section and in an expanded configuration in the bowl-shaped section In one embodiment, the delivery of the RF power by the hollow RF feed bypasses a central portion of the facility plate having a conducting component coupled thereto, the conducting component defined within an interior of the hollow RF feed.

In one embodiment, the conducting component is one of a heating device, an electrostatic clamping device, a coolant fitting, and a pin lifter.

In one embodiment, applying the RF power to the second end of the hollow RF feed includes contacting the second end at a location lateral to the chuck assembly.

In one embodiment, the method further includes shielding a first portion of the hollow RF feed from a second portion of the hollow RF feed by a grounded shield, the first portion including the first end of the hollow RF feed and the second portion including the second end of the hollow RF feed.

In one embodiment, the method further includes insulating an interior surface of a portion of the hollow RF feed.

In one embodiment, contacting the first end of the hollow RF feed to the periphery of the facility plate includes contacting the periphery at a circumference defined on an underside of the facility plate, the circumference having a radius greater than one-half of a radius of the facility plate.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe apparatus and methods for a peripheral RF feed and symmetric RF return for symmetric RF delivery. It will be apparent that the present embodiments may be practiced without some or all of these specific details. In other instances, well known process operations have not been described in detail in order not to unnecessarily obscure the present embodiments.

Exciting an electric field between two electrodes is one of the methods to obtain RF gas discharge in an etching chamber. When an oscillating voltage is applied between the electrodes, the discharge obtained is referred to as a capacitive coupled plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls, to strike the wafer surface with enough energy to remove material from the surface of the wafer.

In one embodiment, Fluorocarbon gases, such as $CF_4$ and $C-C_4F_8$, are used in the dielectric etch process for their anisotropic and selective etching capabilities, but the principles described herein can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices.

Figure 1:
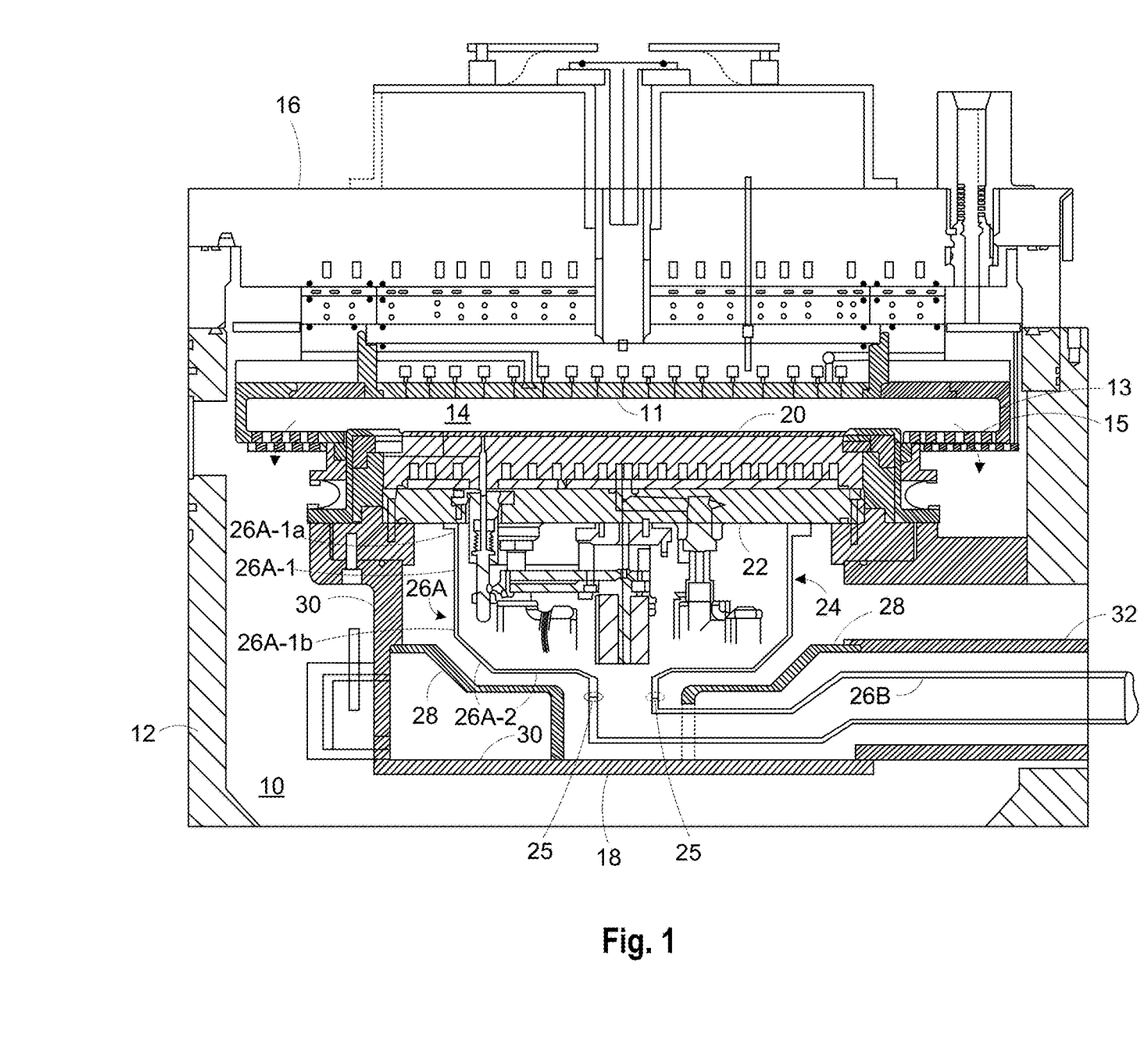
FIG. 1 illustrates a cross section of a plasma reactor, in accordance with an embodiment of the invention.

FIG. 1 illustrates a cross section of a plasma reactor, in accordance with an embodiment of the invention. The reactor includes a surrounding chamber 10 defined by an surrounding chamber wall 12, and a plasma confinement chamber 14 defined by a top electrode assembly 16 and a lower chuck assembly 18. The chuck assembly 18 includes an electrostatic chuck 20 which provides a substrate support surface on its top side, and provides for electrostatic clamping of a substrate to its substrate support surface. A facility plate 22 is coupled to the electrostatic chuck 20 on a side opposite the substrate support surface. Various facility components are coupled to the facility plate 22, such as components relating to heating, cooling, control of lift pins, and electrostatic clamping.

As shown, the top electrode assembly 16 includes a showerhead 11 for feeding process gas into the plasma confinement chamber 14. The top electrode assembly also includes a shroud 13, which engages with the chuck assembly 18 to define the plasma confinement chamber 14. Perforations 15 are defined for gas flow exiting the plasma confinement chamber 14.

A hollow RF feed 24 is coupled to a peripheral portion of the facility plate 22, so as to deliver RF power to the edge of the facility plate 22. This configuration enables the RF current to bypass the interior portion of the facility plate 22, so that child components coupled to the facility plate are not in the path of RF current. In this manner, RF delivery to a substrate situated on the chuck assembly is achieved with high azimuthal uniformity.

The hollow RF feed 24 includes a first portion 26A which connects to the facility plate 22, and a second portion 26B which extends laterally away from the chuck assembly 18. As shown in the illustrated embodiment, the hollow RF feed 24 joins to the periphery of the facility plate 22 at one end, while extending away from the facility plate to a RF source at its opposite end. The first portion 26A which connects to the facility plate is a bowl-shaped section generally having a larger diameter than the second portion 26B so as to accommodate facilities attached to the facility plate 22 on its interior. The first portion 26A includes an upper cylindrical portion 26A-1 and a lower base portion 26A-2. The upper cylindrical portion defines vertical sidewalls extending from a top end 26A-1a at the facility plate to a bottom end 26A-1b. The lower base portion defines tapered sidewalls extending inward from the bottom end 26A-1b of the cylindrical portion 26A-1 to the second portion 26B of the hollow RF feed. The second portion 26B is a tubular section extending away from the chuck assembly. It will be appreciated that in various embodiments the relative diameters of the first portion 26A and the second portion 26B may vary. The second portion 26B connects to a hole in the bowl-shaped section defined by the first portion 26A at an interface 25. Thus, various child facility components coupled to the facility plate are contained within the interior of the first portion 26A of the hollow RF feed.

Additionally, a ground shield 28 is provided as part of the chuck assembly 18. The ground shield 28 facilitates a substantially symmetric RF return current. The ground shield 28 is defined so as to surround the region of the hollow RF feed 24 where the first portion 26A and the second portion 26B are connected. As shown, the ground shield 28 is disposed below and surrounding the lower base portion 26A-2 up to and without surrounding the upper cylindrical portion 26A-1. Thus, the ground shield 28 defines a barrier between the first portion 26A and the second portion 26B of the hollow RF feed 24. The ground shield 28 is connected to the chuck assembly wall 30, from which a RF ground adapter tube 32 extends to ground. Together, the chuck assembly wall 30, the ground shield 28, and the RF ground adapter tube 32 from a return path for the RF current delivered via the hollow RF feed tube 24. It will be noted that part of the second portion 26B of the hollow RF feed is defined within the interior of the RF ground adapter tube 32. This part of the second portion 26B of the hollow RF feed and the RF ground adapter tube 32 together define a coaxial section.

Figure 2:
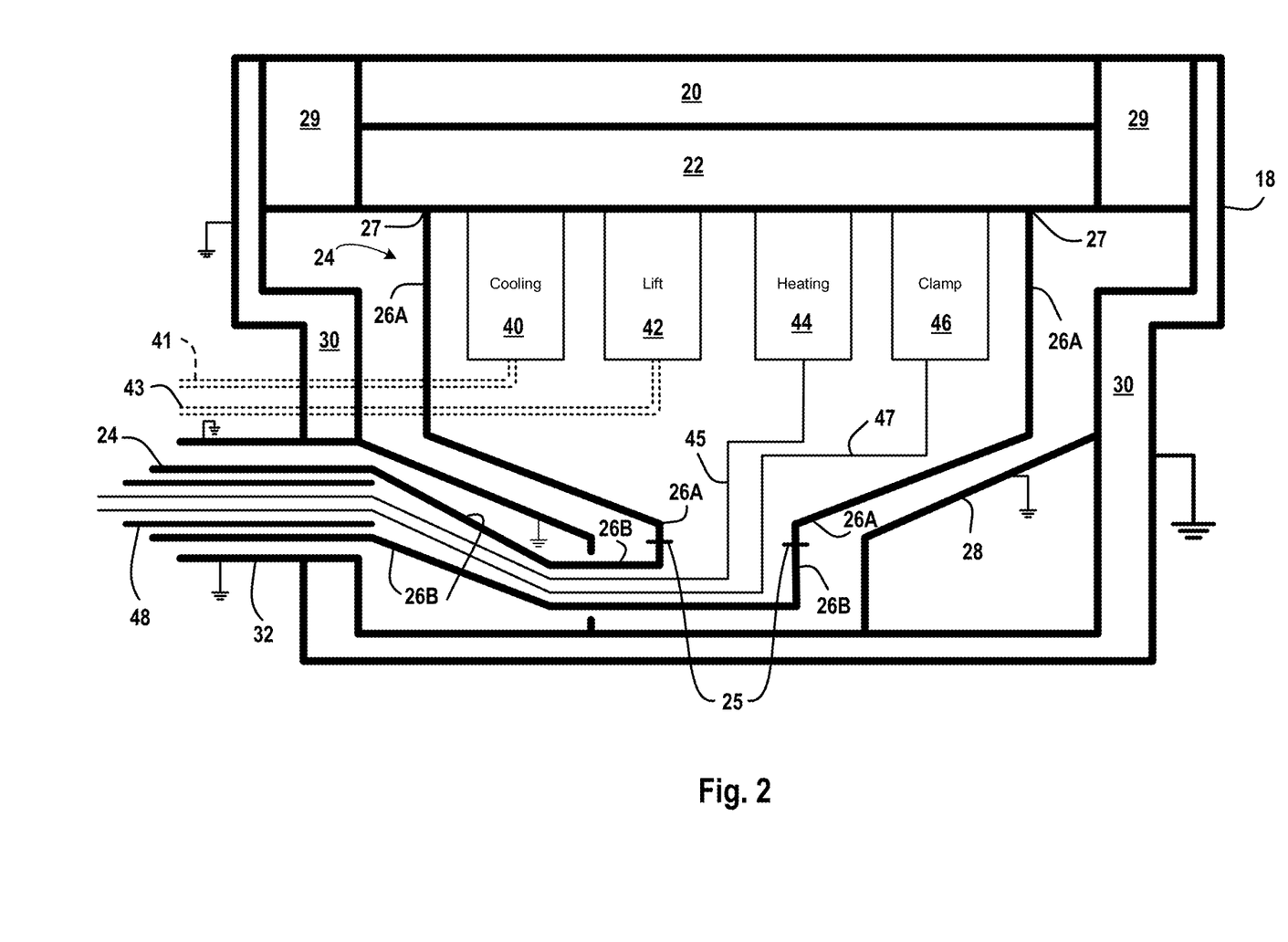
FIG. 2 illustrates a cross section schematic of the chuck assembly 18, in accordance with an embodiment of the invention.

FIG. 2 illustrates a cross section schematic of the chuck assembly 18, in accordance with an embodiment of the invention. As shown, various components are coupled to the facility plate 22, including cooling component 40, lift pin component 42, heating component 44, and clamping component 46. The heating and clamping components are electrically conductive, and therefore especially likely to interfere with symmetric RF delivery and return in conventional plasma processing systems. However, even non-electrically based components, such as liquid or gas-based cooling components and pneumatic lift pin components, can reduce symmetry of RF delivery to the substrate in conventional systems, because their coupling to the facility plate may necessitate alterations in the surface structure of the facility plate. Furthermore, such components may actually include conductive features in addition to non-conductive features. For example, the cooling component 40 can include a coolant fitting that is conductive and may interfere with RF delivery. And the lift pin component 42 can include a pin lifter which is conductive and may also interfere with RF delivery. However, despite these potential sources of interference, by utilizing the hollow RF feed as disclosed herein to deliver RF power directly to the periphery of the facility plate, improved symmetry of RF delivery is achieved because the child components and their various features are not in the path of the RF delivery.

The first portion 26A of the hollow RF feed connects to the facility plate 22 at a circumference 27 defined on the underside of the facility plate 22. The circumference 27 is defined at the periphery or edge of the facility plate 22. The circumference 27 is concentric with the facility plate 22. In one embodiment, the circumference 27 has a radius that is greater than one-half the radius of the facility plate 22 but less than the full radius of the facility plate 22.

The electrostatic chuck 20 and the facility plate 22 are separated from the chuck assembly wall 30 by a dielectric spacer 29. The RF path can broadly be defined by an RF delivery path to a substrate, and an RF return path. The RF delivery path provides for RF delivery along the hollow RF feed 24 to the circumference 27 of the facility plate 22, and around the edges of the facility plate 22 and electrostatic chuck 20 to the substrate. The RF return path follows along the chuck assembly wall 30 and the ground shield 28, ultimately connecting to ground via the RF ground adapter tube 32.

In the illustrated embodiment, fluid tubes 41 and 43 for connecting to the cooling component 40 and lift pin component 42, respectively, are permitted to cross the hollow RF feed 24 because they are non-conducting and cause little interference with the symmetry of RF delivery. However, facility wires 45 and 47 for heating component 44 and clamping component 46, respectively, are carried within the interior of the hollow RF feed 24.

At a minimum for a system including the heating component 44 and the clamping component 46, there are two wires per component, for a total of at least four wires. In some embodiments, there may be additional heating component wires. For example, in one embodiment there are four heating zones each of which is provided with a pair of wires. In such an embodiment, there are a total of ten wires which are fed through the hollow RF feed 24 to the heating component 44 and clamping component 46.

In one embodiment, an insulated tube 48 is provided within the second portion 26B of the hollow RF feed. The insulated tube 48 is composed of an insulating material such as Teflon®.

Figure 3:
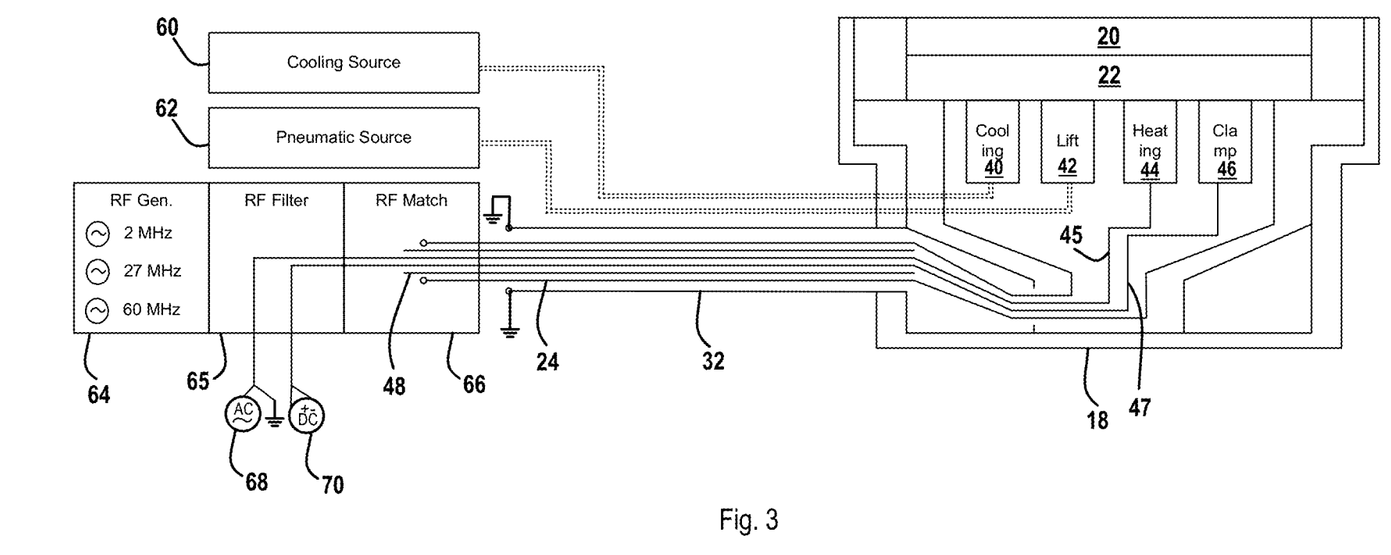
FIG. 3 illustrates various systems connected to a chuck assembly, in accordance with an embodiment of the invention.

FIG. 3 illustrates various systems connected to a chuck assembly, in accordance with an embodiment of the invention. As shown, the cooling component 40 connects to a cooling source 60, which provides liquid or gaseous fluids for cooling the electrostatic chuck 20. The lift component 42 connects to a pneumatic source 62, which provides compressed gas for controlling lift pins which facilitate disengagement of a substrate from the electrostatic chuck 20.

The hollow RF feed 24 is supplied with RF power from an RF generator 64, via an RF filter 65 and RF match 66. Wires 45 provide current to heating component 44 from an AC source 68. Wires 47 provide current to clamping component 46 from a high voltage DC source 70.

Figure 4:
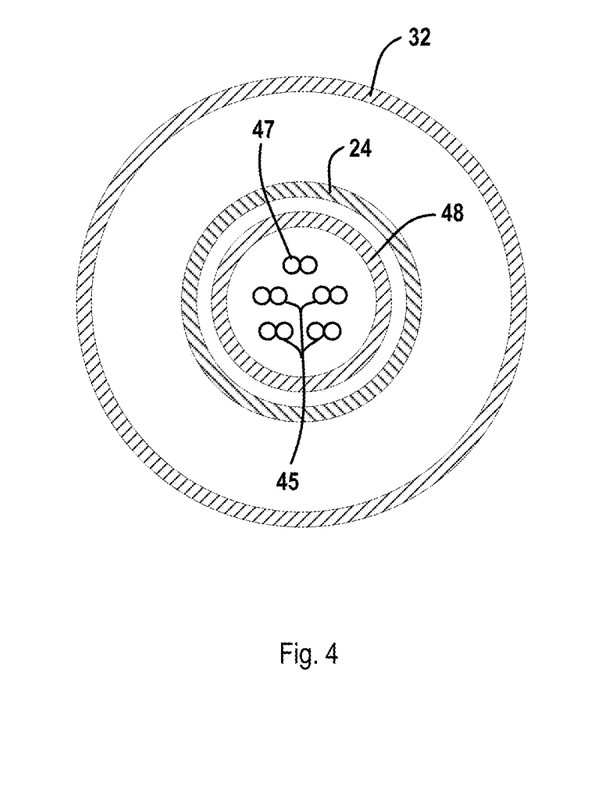
FIG. 4 illustrates a cross section of a portion of the hollow RF feed and RF ground adapter tube, in accordance with an embodiment of the invention.

FIG. 4 illustrates a cross section of a portion of the hollow RF feed and RF ground adapter tube, in accordance with an embodiment of the invention. As shown, the configuration of the portion of the hollow RF feed 24 inside of the RF ground adapter tube 32 defines a coaxial segment where the hollow RF feed 24 acts as the inner conductor and the RF ground adapter tube 32 acts as the outer conductor, so as to promote low-loss transmission of RF power without causing interference to nearby components.

Additionally, the insulated tube 48 is shown inside of the hollow RF feed 24. According to one embodiment, the insulated tube 48 is a Teflon® tube. In the illustrated embodiment, there are four pairs of wires 45 which connect to four distinct zone heating elements, and one pair of high voltage wires 47 for electrostatic clamping. In one embodiment, the wires are threaded through RF feed straps.

Figure 5:
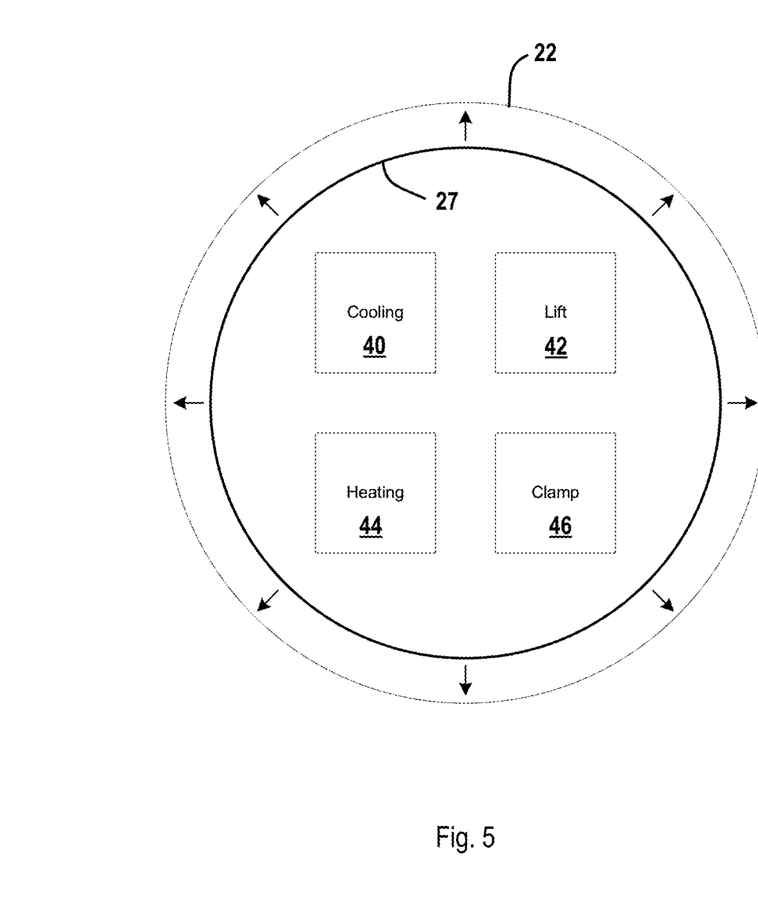
FIG. 5 illustrates the underside of the facility plate of the chuck assembly, in accordance with an embodiment of the invention.

FIG. 5 illustrates the underside of the facility plate of the chuck assembly, in accordance with an embodiment of the invention. As shown, the facility plate 22 has various facility components coupled thereto, including cooling component 40, lift component 42, heating component 44, and clamping component 46. The hollow RF feed contacts the facility plate at the circumference 27 defined at the periphery of the underside of the facility plate 22. As shown, the circumference 27 is concentric with the facility plate so as to facilitate symmetric RF delivery from the hollow RF feed to the edge of the facility plate 22. Furthermore, the circumference encircles the positions of the various facility components on the facility plate 22, so that the facility components are not in the RF delivery path. In one embodiment, the radius of the circumference 27 is at least one-half the radius of the facility plate 22. In another embodiment, the radius of the circumference 27 is at least two-thirds the radius of the facility plate 22. In still other embodiments, the circumference 27 can have any radius that defines the circumference 27 in a peripheral vicinity of the facility plate 22.

Figure 6:
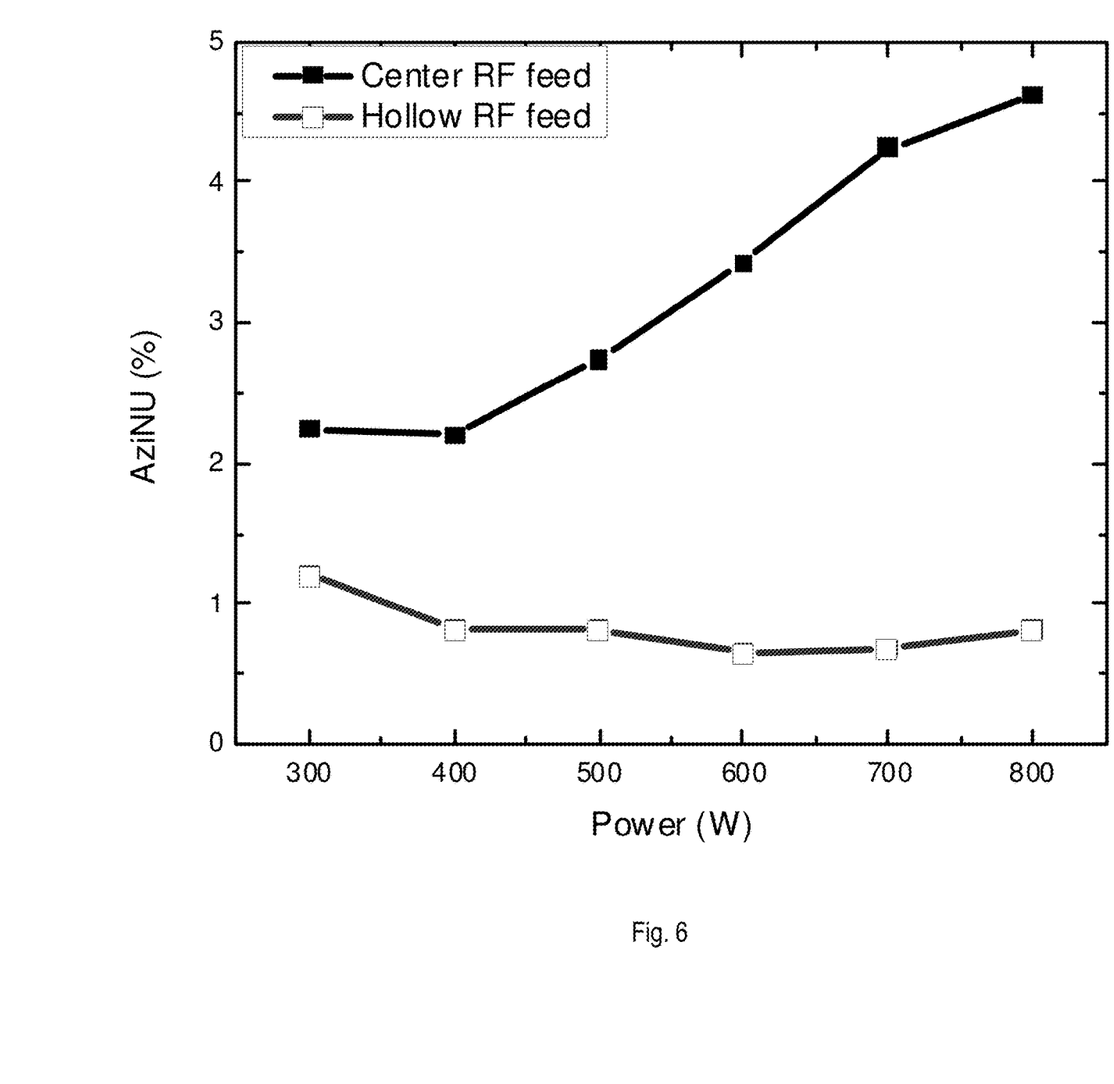
FIG. 6 is a graph comparing azimuthal nonuniformity of substrates processed using a chuck assembly having a center RF feed versus a chuck assembly having a hollow RF feed, in accordance with an embodiment of the invention.

FIG. 6 is a graph comparing azimuthal nonuniformity of substrates processed using a chuck assembly having a center RF feed versus a chuck assembly having a hollow RF feed, in accordance with an embodiment of the invention. As can be seen, substrates processed using a chuck assembly having a hollow RF feed as described herein demonstrate noticeably lower levels of azimuthal non-uniformity. This holds true across of range of RF power settings, with the improvement in azimuthal non-uniformity of the hollow RF feed over the center RF feed generally increasing with increasing power.

Between 300 and 800 watts, the azimuthal nonuniformity for a center RF feed approximately doubles. By contrast, the hollow RF feed demonstrates fairly constant azimuthal non-uniformity across the same power range, with a lower level of non-uniformity overall as well. Azimuthal nonuniformity was measured by measuring etch rates of a blank wafer, and subtracting for radial nonuniformity. Additional details regarding the measurement of various metrics may be found with reference to U.S. Pat. No. 7,239,737, issued Jul. 3, 2007, entitled "USER INTERFACE FOR QUANTIFYING WAFER NON-UNIFORMITIES AND GRAPHICALLY EXPLORE SIGNIFICANCE," the disclosure of which is herein incorporated by reference.

Figure 7A:
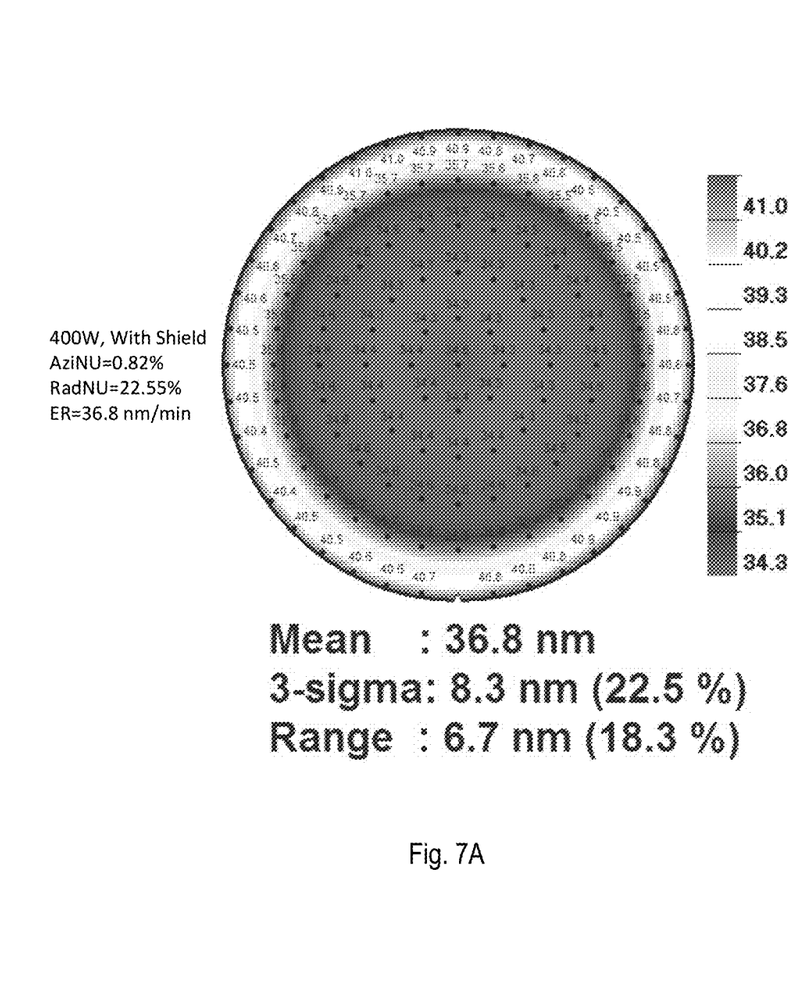
FIGS. 7A-F illustrate the effect of the ground shield on azimuthal nonuniformity, in accordance with an embodiment of the invention.
Figure 7B:
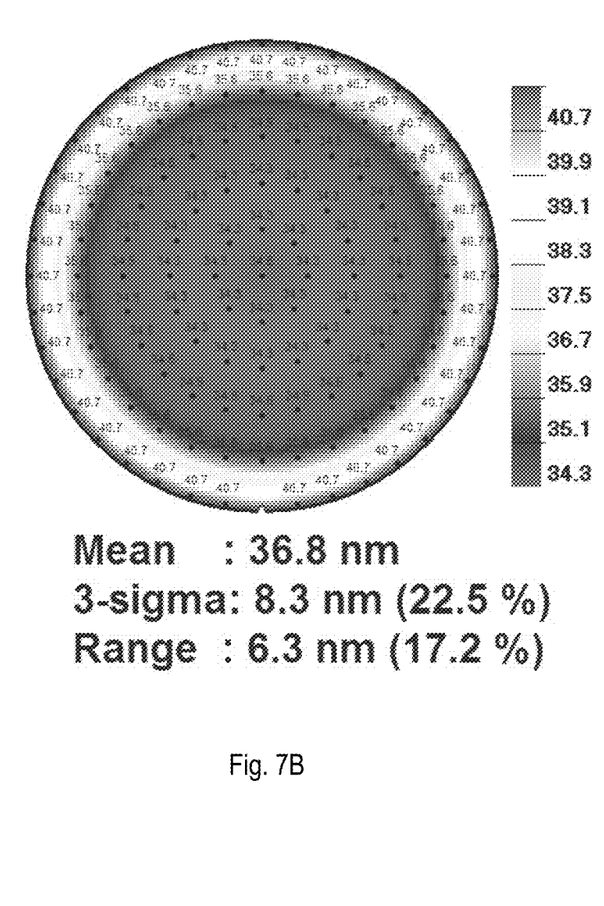

FIGS. 7A-F illustrate the effect of the ground shield on azimuthal nonuniformity, in accordance with an embodiment of the invention. Specifically, FIG. 7A illustrates a plot of etch rates at selected points at various constant radii for a wafer on a chuck assembly including a ground shield as described herein. FIG. 7B illustrates azimuthal average values of etch rate at each constant radius, which overall indicates radial non-uniformity. In other words, for each constant radius, the plotted value for any azimuth is the average of the original etch rates at that radius. By subtracting the azimuthal average values of FIG. 7B from the corresponding actual etch rate values of FIG. 7A, we obtain a residual plot, shown at FIG. 7C, which indicates residual non-uniformity after radial non-uniformity has been substracted. The azimuthal non-uniformity is then calculated as the 3-sigma variation of the residual plot divided by the mean etch rate. As shown, the azimuthal non-uniformity based on the illustrated wafer plots of FIGS. 7A-C for a system including a ground shield is 0.82%.

Figure 7C:
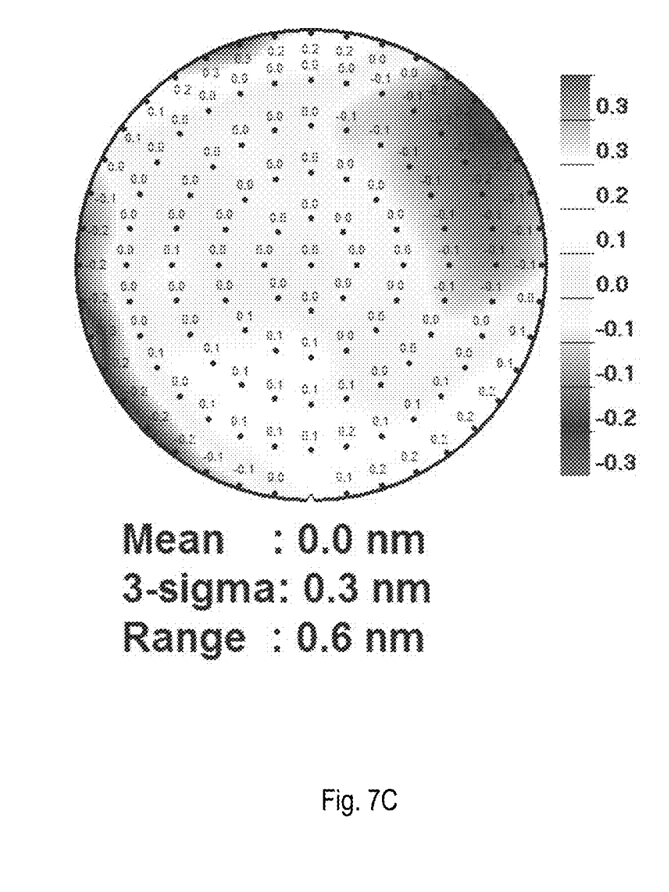
Figure 7D:
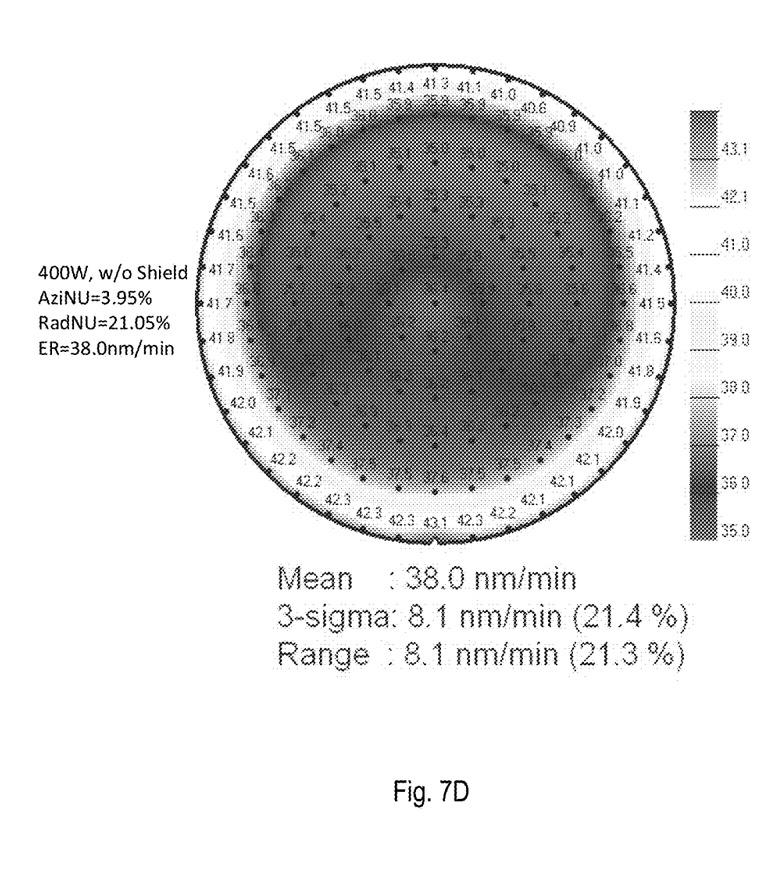
Figure 7E:
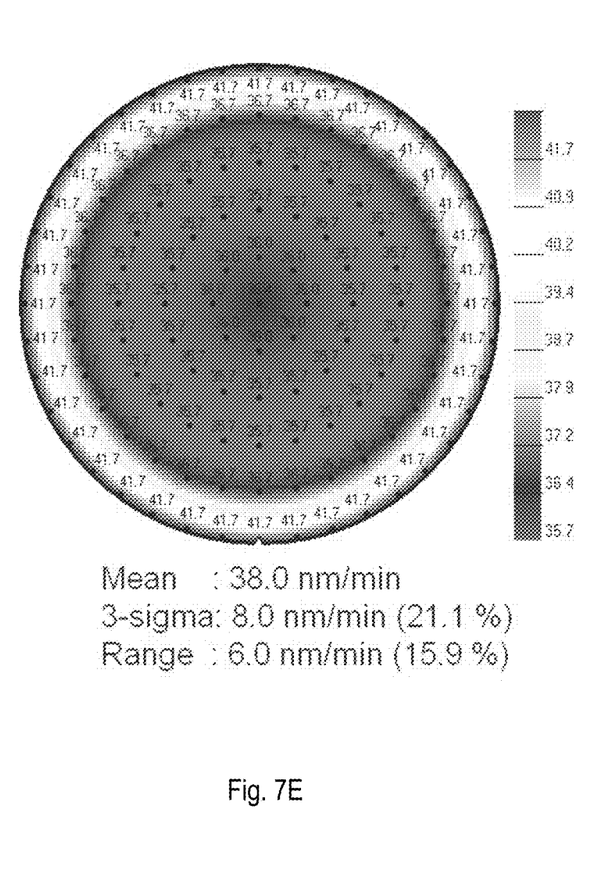
Figure 7F:
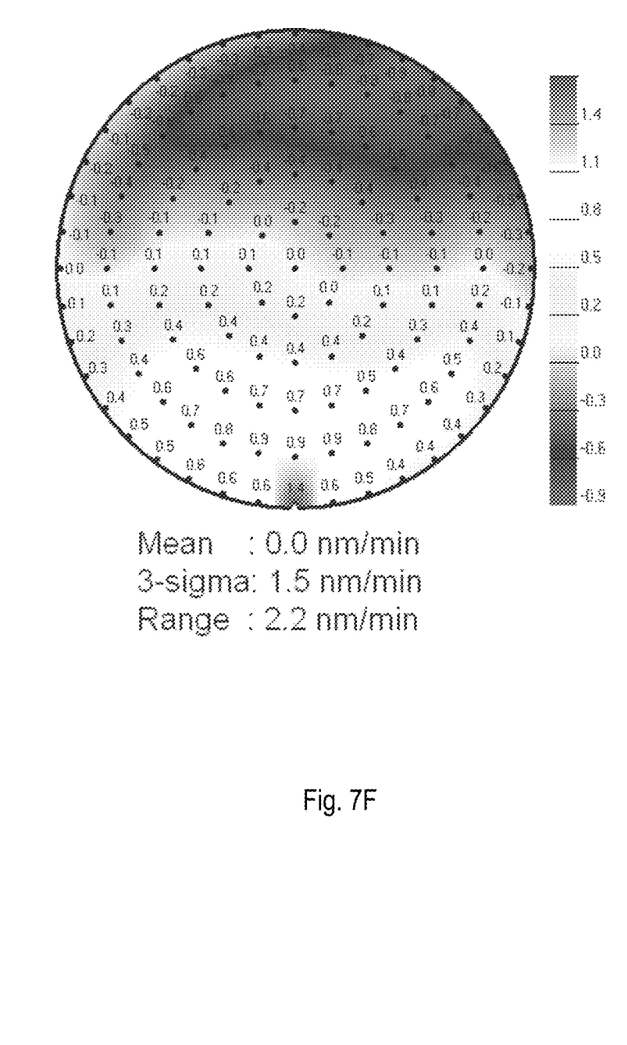

FIGS. 7D-F illustrate corresponding plots to those of FIGS. 7A-C, respectively, for a wafer on a chuck assembly without the ground shield. In this instance, the azimuthal non-uniformity is significantly increased to 3.95%. Thus it can be seen that the presence of the ground shield, which provides for improved symmetry of the RF return path, provides a significant benefit by reducing azimuthal non-uniformity.

Figure 8:
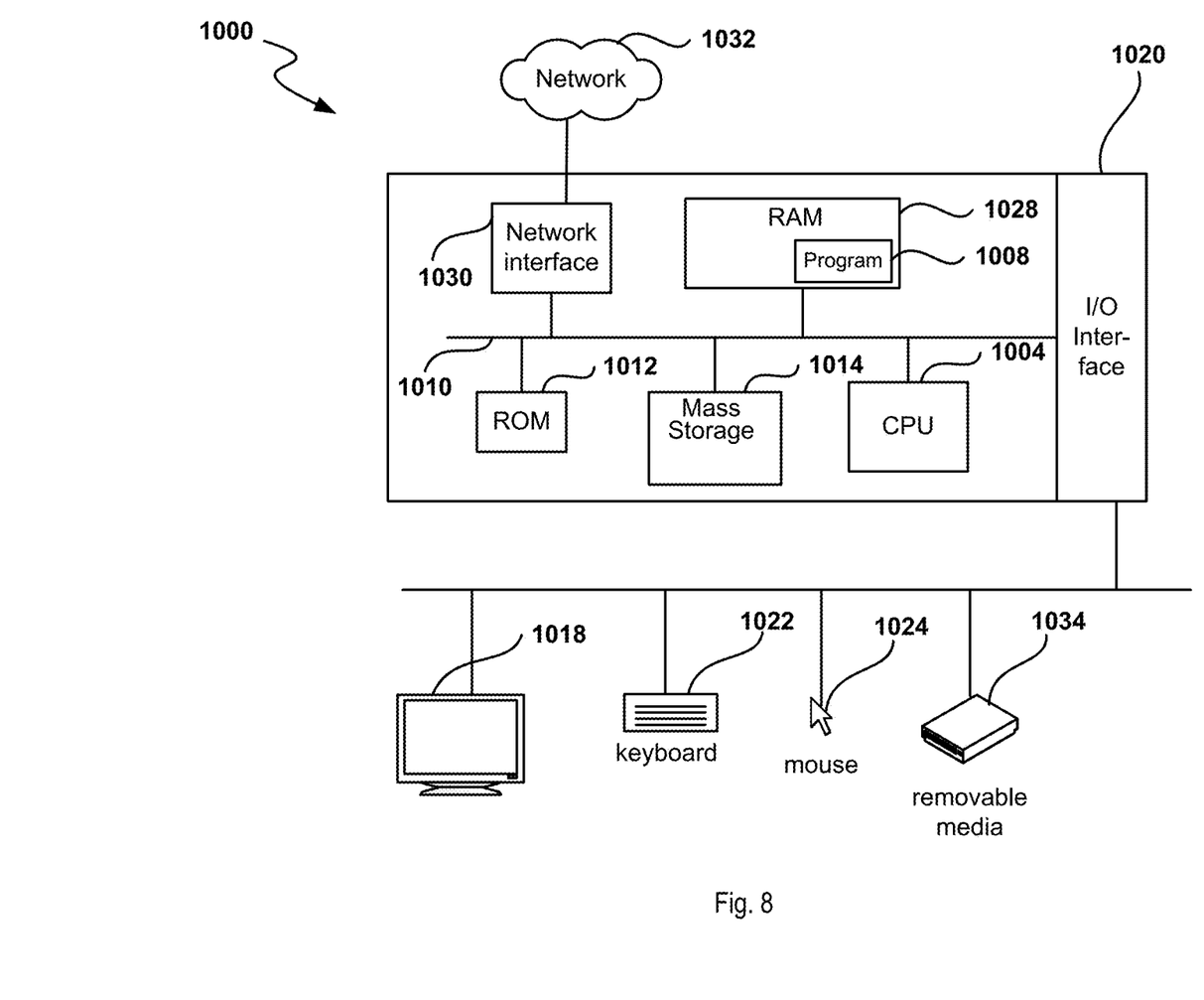
FIG. 8 is a simplified schematic diagram of a computer system for implementing embodiments described herein.

FIG. 8 is a simplified schematic diagram of a computer system for implementing embodiments described herein. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1004, which is coupled through bus 1010 to random access memory (RAM) 1028, read-only memory (ROM) 1012, and mass storage device 1014. Phase control program 1008 resides in random access memory (RAM) 1028, but can also reside in mass storage 1014 or ROM 1012.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface provides communication with different peripherals and is connected with CPU 1004, RAM 1028, ROM 1012, and mass storage device 1014, through bus 1010. Sample peripherals include display 1018, keyboard 1022, cursor control 1024, removable media device 1034, etc.

Display 1018 is configured to display the user interfaces described herein. Keyboard 1022, cursor control 1024, removable media device 1034, and other peripherals are coupled to I/O interface 1020 in order to communicate information in command selections to CPU 1004. It should be appreciated that data to and from external devices may be communicated through I/O interface 1020. The embodiments can also be practiced in distributed computing environments where tasks are performed by remote processing devices that are linked through a wire-based or wireless network.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A chuck assembly for plasma processing, comprising:
   an electrostatic chuck having a substrate support surface on a first side;
   a facility plate coupled to the electrostatic chuck on a second side that is opposite the substrate support surface;
   a RF feed configured to deliver RF power, the RF feed defined by a first portion contacting a periphery of the facility plate and a second portion coupled to the first portion, the second portion extending away from the chuck assembly, the first portion being a bowl-shaped section, wherein the second portion connects to the first portion at an opening defined in the bowl-shaped section;
   wherein the first portion of the RF feed contacts the periphery of the facility plate at a circumference defined on a side of the facility plate opposite the electrostatic chuck, the circumference having a radius greater than one-half of a radius of the facility plate, the radius of the circumference being less than the radius of the facility plate;
   a grounded shield disposed below and surrounding at least a portion of the bowl-shaped section.

2. The chuck assembly of claim 1, wherein facility wires are fed through an interior of the first and second portions of the RF feed.

3. The chuck assembly of claim 2, wherein the facility wires are in a bundled configuration in an interior of the second portion, and wherein the facility wires are in an expanded configuration in an interior of the first portion.

4. The chuck assembly of claim 1, further comprising a conducting component coupled to the facility plate and defined within the interior of the bowl-shaped section of the RF feed.

5. The chuck assembly of claim 4, wherein the conducting component is one of a heating device, an electrostatic clamping device, a coolant fitting, or a pin lifter.

6. The chuck assembly of claim 1, wherein the second portion extends downward or laterally away from the chuck assembly.

7. The chuck assembly of claim 1, wherein an insulating tube is defined within an interior of the second portion of the RF feed.

8. The chuck assembly of claim 1, wherein one or more fluid tubes are routed over the grounded shield and through the bowl-shaped section of the RF feed to the facilities plate.

9. The chuck assembly of claim 1, wherein the circumference has a radius greater than two-thirds of a radius of the facility plate, and the radius of the circumference being less than the radius of the facility plate.

10. A chuck assembly for plasma processing, comprising:
    an electrostatic chuck having a substrate support surface on a first side;
    a facility plate coupled to the electrostatic chuck on a second side that is opposite the substrate support surface;
    a RF feed configured to deliver RF power, the RF feed defined by a bowl-shaped section contacting a periphery of the facility plate and a tubular section coupled to the bowl-shaped section, the tubular section extending away from the chuck assembly, wherein the tubular section connects to the bowl-shaped section at an opening defined in the bowl-shaped section;
    wherein the bowl-shaped section of the RF feed contacts the periphery of the facility plate at a circumference defined on a side of the facility plate opposite the electrostatic chuck, the circumference having a radius greater than one-half of a radius of the facility plate, the radius of the circumference being less than the radius of the facility plate.

11. The chuck assembly of claim 10, further comprising: a grounded shield disposed below and surrounding the bowl-shaped section.

12. The chuck assembly of claim 10, wherein the RF feed contains facility wires in a bundled configuration in the tubular section and in an expanded configuration in the bowl-shaped section.

13. The chuck assembly of claim 10, further comprising a conducting component coupled to the facility plate and defined within an interior of the bowl-shaped section of the RF feed.

14. The chuck assembly of claim 13, wherein the conducting component is one of a heating device, an electrostatic clamping device, a coolant fitting, or a pin lifter.

15. The chuck assembly of claim 10, wherein the tubular section extends downward or laterally away from the chuck assembly.

16. The chuck assembly of claim 10, wherein an insulating tube is defined within an interior of the tubular section of the RF feed.

17. The chuck assembly of claim 10, wherein the circumference has a radius greater than two-thirds of a radius of the facility plate, and the radius of the circumference being less than the radius of the facility plate.

* * * * *